United States Patent [19]

Howard

[11] Patent Number: 5,589,714
[45] Date of Patent: Dec. 31, 1996

[54] EPOXY POLYMER FILLED WITH ALUMINUM NITRIDE-CONTAINING POLYMER AND SEMICONDUCTOR DEVICES ENCAPSULATED WITH A THERMOSETTING RESIN CONTAINING ALUMINUM NITRIDE PARTICLES

[75] Inventor: Kevin E. Howard, Midland, Mich.

[73] Assignee: The Dow Chemical Company, Midland, Mich.

[21] Appl. No.: 410,264

[22] Filed: Mar. 24, 1995

Related U.S. Application Data

[63] Continuation-in-part of Ser. No. 351,450, Dec. 8, 1994, Pat. No. 5,508,110, filed as PCT/US93/00978, Jan. 28, 1993 published as WO93/25496, Dec. 23, 1993 which is a continuation-in-part of Ser. No. 895,496, Jun. 8, 1992, Pat. No. 5,234,712.

[51] Int. Cl.[6] .................................................. H01L 23/29
[52] U.S. Cl. ........................ 257/788; 257/639; 257/649; 257/703; 257/789; 257/795
[58] Field of Search .................................... 257/787, 788, 257/789, 795, 639, 649, 703, 708

[56] References Cited

U.S. PATENT DOCUMENTS

| | | | |
|---|---|---|---|
| 4,528,244 | 7/1985 | Winkelbauer et al. | 428/446 |
| 4,818,635 | 4/1989 | Ekström et al. | 428/698 |
| 4,950,558 | 8/1990 | Sarin | 428/698 |
| 5,011,870 | 4/1991 | Peterson | 523/220 |
| 5,019,554 | 5/1991 | Takeshita et al. | 505/1 |
| 5,150,195 | 9/1992 | Nguyen | 252/512 |
| 5,202,059 | 4/1993 | Kennedy | 252/389.31 |
| 5,202,753 | 4/1993 | Shintai | 257/789 |
| 5,213,868 | 5/1993 | Liberty et al. | 428/131 |
| 5,221,339 | 6/1993 | Takahashi et al. | 106/287.13 |
| 5,232,970 | 8/1993 | Solc et al. | 524/404 |
| 5,250,848 | 10/1993 | Christie et al. | 257/778 |
| 5,288,769 | 2/1994 | Papageorge et al. | 523/200 |
| 5,298,328 | 3/1994 | Abe et al. | 428/403 |
| 5,349,240 | 9/1994 | Narita et al. | 257/789 |
| 5,391,924 | 2/1995 | Uchida et al. | 257/789 |
| 5,430,330 | 7/1995 | Takahama et al. | 257/789 |

FOREIGN PATENT DOCUMENTS

| | | |
|---|---|---|
| 2066867 | 10/1992 | Canada . |
| 5247181 | 9/1993 | Japan . |
| 5247182 | 9/1993 | Japan . |

OTHER PUBLICATIONS

Stuart M. Lee "Electrical and Electronic Applications", *Epoxy Resins*, pp. 783–884, 2nd Ed., 1988 no month.
P. Bujard et al., "Thermal Conductivity of Molding Compounds for Plastic Packaging", 44th Electronic Components and Technology Conference, Wash. D.C. May 1–4, 1994.
P. Bujard, et al., "Thermal Conductivity of a Chain of Particles in Close Contact in a Matrix of Epoxy Resin", 22nd Int'l Thermal Conductivity Conf., Phoenix, 1993.

*Primary Examiner*—Sara W. Crane
*Assistant Examiner*—David B. Hardy

[57] ABSTRACT

Semiconductor devices are encapsulated in a thermosetting resin filled with aluminum nitride particles. The aluminum nitride particles have an outer layer of Al—O—N, into which is incorporated amorphous Si—O, which renders them hydrolytically stable. The aluminum nitride particles impart very high thermal conductivity to the cured resin. In addition, the cured resin has a CTE similar to that of the encapsulated semiconductor device, and has excellent dielectric properties.

10 Claims, No Drawings

EPOXY POLYMER FILLED WITH ALUMINUM NITRIDE-CONTAINING POLYMER AND SEMICONDUCTOR DEVICES ENCAPSULATED WITH A THERMOSETTING RESIN CONTAINING ALUMINUM NITRIDE PARTICLES

CROSS-REFERENCE TO RELATED APPLICATIONS

This application is a continuation-in-part of U.S. application Ser. No. 08/351,450, filed Dec. 8, 1994, now U.S. Pat. No. 5,508,110, which is a national phase application of PCT/US93/00978, filed Jan. 28, 1993, and which is a continuation-in-part of U.S. application Ser. No. 07/895,496, filed Jun. 8, 1992, now U.S. Pat. No. 5,234,712. U.S. application Ser. Nos. 08/351,450 and 07/895,496 and PCT/US93/00978 are all incorporated herein by reference in their entirety.

BACKGROUND OF THE INVENTION

This invention relates to semiconductor devices which are encapsulated in a filled organic resin.

Semiconductor devices are commonly encapsulated to protect them from exposure to environmental hazards such as air, moisture, chemicals, dust and light, and to provide them with greater physical strength. The encapsulating material must be an electrical insulator, and for that reason ceramic materials and, more typically, formulated organic resins are used for that purpose. The most common of these resins are thermosetting epoxy resins.

Inert fillers are almost always present in resin systems used to encapsulate semiconductor devices. The most common filler is fused silica. Fillers such as fused silica decrease the coefficient of thermal expansion (CTE) of the resin system to more closely match that of the encapsulated metal lead frames and semiconductor dies. This prevents damage to the device from thermal cycling and reduces compressive and shear forces on the surface of the semiconductor.

Semiconductor devices generate heat as they operate. As these devices become more complex with more closely spaced elements on their surface, removal of this heat becomes a significant problem. A major disadvantage of silica-filled epoxy encapsulants is their low thermal conductivity, which inhibits rapid dissipation of heat from the embedded semiconductor. For this reason, methods are desired by which improved heat dissipation can be achieved.

One approach has been to incorporate metal heat sinks or metal heat spreaders into the encapsulated devices. These provide a means for rapid heat dissipation, but interject additional parts and manipulative steps into the manufacturing process, which substantially increases the cost.

Another approach has been to encapsulate the semiconductor in a resin loaded with a highly thermally conductive filler. For example, aluminum oxide (alumina), silicon carbide, silicon nitride and aluminum nitride fillers have all been tried. All of these improve the thermal conductivity of the encapsulant relative to fused silica. Unfortunately, all suffer from significant disadvantages. Some substantially increase the CTE of the encapsulant, making the device more susceptible to damage from thermal cycling and die stress. Others, like silicon carbide and alumina, are very hard materials which can cause excessive erosion of the molding equipment used to encapsulate the devices. Silicon carbide has a high dielectric constant, which makes it unsuitable for most applications. Silicon nitride and alumina impart better thermal conductivity to the encapsulant than does fused silica, but not as much as desired, and silicon nitride is hydrolytically unstable as well. Aluminum nitride is hydrolytically unstable, and can react with ambient moisture to cause dimensional instability, and generate alkaline byproducts which attack the metal conductor on the semiconductor surface.

Accordingly, it would be desirable to provide an encapsulated semiconductor device with greater ability to dissipate heat than devices encapsulated with a fused silica-filled resin. It would be further desirable if such a device were encapsulated in a material having a CTE close to that of silicon, and which does not require the incorporation of metal heat sinks and/or metal heat spreaders into the device.

SUMMARY OF THE INVENTION

In one aspect, this invention is an encapsulated semiconductor device, comprising:

(a) a semiconductor device, which is encapsulated in (b) a cured thermosetting resin filled with from about 1 to about 90 weight %, based on the combined weight of the resin and aluminum nitride particles, of aluminum nitride particles which have an outer layer of Al—O—N into which amorphous Si—O is incorporated and (c) a plurality of conductive leads which are in electrical connection with said semiconductor device and which extend through the cured thermosetting resin.

The presence of the AlN particles having the the outer amorphous Si—O-containing Al—O—N layer provides several benefits. First, these particles impart excellent thermal conductivity to the encapsulating resin, allowing for the efficient dissipation of heat from the semiconductor device during its operation. This permits the encapsulation of larger or higher power devices, or the closer spacing of devices, than can be achieved using a conventional fused silica-filled encapsulant. Because these AlN particles have a low dielectric constant, the encapsulant is suitable for most semiconductor applications. The AlN also imparts to the encapsulant a CTE close to that of silicon and leadframe metals, which greatly increases the resistance of the encapsulated device to damage caused by thermal cycling. The Si—O-containing Al—O—N layer further imparts hydrolytic stability to the AlN particles, which substantially eliminates the hydrolytic instability and associated dimensional stability and alkaline byproducts which are seen with conventional AlN fillers.

Significant processing advantages are also achieved when a semiconductor device is encapsulated with a resin filled with AlN particles having a coating which imparts hydrolytic stability. The high thermal conductivity imparted to the resin by the AlN particles causes it to heat and cure quickly. As a result, the resin cures rapidly, thereby requiring less in-mold residence time. This translates into shorter cycle times and greater production from each mold machine. A second benefit is that quite often the post-mold curing which is now commonly done may in some instances be eliminated. A third advantage is that the resin composition can be heated quickly to its softening point in the molding apparatus itself. This permits one to eliminate the preheating step which is now used to soften fused silica-filled resins before they can be processed in resin transfer molding equipment.

Thus, in a second aspect, this invention is an improvement in a semiconductor encapsulating process wherein a normally solid, heat softened thermosetting resin is injected into a mold cavity using a resin transfer molding apparatus which contains a semiconductor device in electrical connection with a plurality of leads, and said thermosetting resin is subsequently cured to form an encapsulated integrated circuit device having leads extending through the cured encapsulating resin. The improvement comprises:

(a) using as the thermosetting resin one which is filled with from about 1 to about 90 weight %, based on the combined weight of the resin and aluminum nitride particles, of aluminum nitride particles which have an outer layer which renders the particles hydrolytically stable, and (b) using no separate preheating of said filled thermosetting resin outside of the resin transfer molding apparatus.

Thus, the process of this invention provides for the elimination of process steps which have heretofore been considered to be essential, thereby improving the efficiency of the process and reducing its cost.

In a third aspect, this invention is an epoxy polymer filed with an aluminum nitride-containing powder, wherein the powder comprises AlN particles which have an outer layer of Al—O—N in which amorphous Si—O is incorporated.

DETAILED DESCRIPTION OF THE INVENTION

In the first aspect of the invention, a semiconductor device is encapsulated in a cured thermosetting resin which is filled with AlN particles which have an outer layer of Al—O—N in which amorphous Si—O is incorporated. Suitable such AlN particles are described in application Ser. No. 895,496, filed Jun. 8, 1992, now U.S. Pat. No. 5,234,712 to Howard, incorporated herein by reference. These particles can be prepared by coating onto AlN particles a solution or suspension of an silicate containing substituent alkyl or alkoxyalkyl groups, and then heating the coated particles to about 350° to about 1000° C. to cause the silicate to react at the surface of the AlN particle. When the AlN particles are treated with the silicate in this manner, an Al—O—N layer incorporating amorphous Si—O is formed at the surface of the particles. This layer is bonded to the underlying AlN. It is noted that the use herein of the notation Al—O—N and Si—O is only for the purpose of identifying the elements which are present; it is not intended to convey any particular relative amounts of the mentioned elements, nor any particular relationship between them. Nor is it intended to exclude the presence of small amounts, on the order of 5% by weight or less, preferably about 1% or less, of other elements.

A preferred AlN contains an additional layer of Si—O, possibly mixed with Al, on the outside of and bonded to the amorphous Si—O-containing Al—O—N layer. This additional layer can be made by treating the coated AlN a second time with the silicate, followed by heating as described.

The AlN particle so prepared generally contains an amorphous Si—O-containing Al—O—N layer ranging in thickness from about 200 to about 1000 nm, preferably about 200 to about 600 nm. If the AlN is treated twice with the silicate, it further has a layer of Si—O or Si—O—Al, which is advantageously from about 600 to about 2500 nm in thickness.

The AlN particles (including surface layers) advantageously have a volume average particle size (greatest dimension) in the range from about 1 to about 500 μm, preferably from about 2 to about 120 μm.

The type of semiconductor device is not critical, and may be of any type, including, for example, a transistor, a diode, a thyristor, a power transistor, a bipolar or MOS integrated circuit, a microprocessor, an application specific integrated circuit (ASIC), a programmable logic integrated circuit, a memory integrated circuit, a power integrated circuit as well as other integrated circuits.

In electrical connection with the semiconductor device are a plurality of leads. The number of leads is not critical to this invention, and depends on the nature and complexity of the semiconductor device. The leads are made of a conductive material, preferably a metal, more preferably aluminum, copper, nickel, gold, platinum or an alloy thereof, most preferably copper or a copper alloy. The leads may be connected to the semiconductor device in any suitable manner. However, the preferred practice is to use a lead frame to which the semiconductor device is adhered, with the individual leads being wire bonded to the semiconductor device. The leads also extend through and out of the encapsulating layer of cured thermoset resin, so as to provide a means for connecting the semiconductor device to other electrical or electronic components.

The semiconductor device is encapsulated in a cured thermoset resin. Preferably, the connections between the leads and the semiconductor device are also encapsulated. In the preferred embodiment wherein a lead frame is wire bonded to the semiconductor device, the encapsulant covers the wire bonding as well. The cured resin advantageously has a glass transition temperature (Tg) of at least about 100° C., preferably at least about 125°, more preferably at least about 150° C. The cured resin also advantageously has a heat distortion temperature of at least about 175° C. As mentioned before, the cured resin is filled with AlN particles having an outer layer of Si—O-containing Al—O—N. These AlN particles advantageously constitute from about 1 to about 90, preferably from about 40 to about 85, more preferably about 60 to about 85 percent of the combined weight of the AlN particles and the cured resin.

The cured resin advantageously has a thermal conductivity of at least about 1.5, preferably at least about 2.5, more preferably at least about 3.0 W/mK. It further advantageously has a dielectric constant of no more than about 10.

The thickness of the encapsulating layer can vary from about 5, preferably from about 10, to about 500 mils, preferably about 10 to about 125 mils. The encapsulating layer is preferably continuous, covering the entire surface of the semiconductor device except where the leads are exposed.

The semiconductor may be encapsulated by a resin transfer molding process, such as is described in Lee, "Electrical and Electronic Applications", *Epoxy Resins*, 2d Ed., pp. 783–884 (Clayton A. May, ed.), Marcel Dekker, Inc. New York, 1988, incorporated herein by reference. In this process, a powdered or pelletized, normally solid uncured resin formulation is heated to a temperature at which it will flow under pressure, and then transferred under pressure to a mold cavity which contains the semiconductor device and attached leads. The formulation is then cured at an elevated temperature in the mold. The encapsulated semiconductor device may be postcured if desired to further develop the physical properties of the resin.

An alternative method is to inject a liquid resin formulation into a mold via an autodispensing process. In this process, the resin, curing agent, AlN filler and other components are formulated so as to be flowable at room temperature (about 25° C.). This flowable mixture is then injected into a mold cavity containing the semiconductor device and attached leads, where it is cured via the application of heat. In this method, the resin formulation is often prepared and frozen in a syringe. While frozen, the resin does not cure, so in this manner a fully formulated resin may be transported or stored for later use. The contents of the syringe are then thawed at the time it is used. The syringe itself may be loaded onto an autodispensing unit.

Other liquid thermosetting resin formulations may also be used, such as the so-called "Blob-Top" encapsulants and other liquid epoxy systems as are used as underfills in flip chip bonding. These latter resin formulations, when filled with AlN particles having an amorphous Si—O-containing Al—O—N layer, can also be used as die attach adhesives and in other applications in which thermal conductivity and electrical resistivity are needed.

The resin may be any thermosetting resin which can cure to form a protective layer about the semiconductor device. Among the suitable resins are phenolic resins, alkyds, diallyl phthalate resins, polycyanate resins, epoxy resins and the like. Epoxy resins are preferred. Among the suitable epoxy resins are those based on bisphenols such as bisphenol A; those based on biphenyl; phenol epoxy novolac resins; cresol epoxy novolac resins; those based on trisphenol methane derivatives; those based on cyclohexane or other alicyclic compounds; and the like. Bromine-substituted epoxy resins may be used to impart flame retardance to the cured resin. The resin is also preferably selected together with a curing agent and other additives such that upon curing it exhibits a glass transition temperature and heat distortion temperature as described before. Suitable epoxy formulations are described, for example, in U.S. Pat. No. 5,232,970 to Solc et al., issued Aug. 3, 1993, incorporated herein by reference.

In addition to the resin and the AlN filler, the preferred epoxy resin formulation will also contain a curing agent. Suitable curing agents include compounds having at least two primary or secondary amine groups, polycarboxylic acids and polyanhydrides, polyphenols, guanidines, biguanides, urea-aldehyde resins, melamine-aldehyde resins, alkoxylated urea-aldehyde resins, alkoxylated melamine-aldehyde resins, amides, sulfones, sulfonamides, or combinations thereof. Particularly suitable curing agents include phenol-formaldehyde novolac resins, cresol-formaldehyde novolac resins dicyclopentadine-phenol resins, dicyclopentadiene-cresol resins, bis-(4-aminophenyl)sulfone, phthalic anhydride, or mixtures thereof. The curing agent is used in an amount which will cure the epoxy resin, such as from about 0.7 to about 1.5 equivalents per epoxide equivalent of the epoxy resin.

Other components or additives may also be used in the preferred epoxy resin formulation, such as catalysts, pigments, dyes, wetting agents, stabilizers, mold release agents, flow control agents, fire retardant agents, surfactants, and the like. Because of the high thermal conductivity imparted to the formulation by the AlN particles, it is usually desirable to reduce the amount of catalyst, relative to that amount used in silica-filled formulations, in order to obtain a suitable curing profile.

The epoxy resin is mixed with the AlN particles, any curing agent which may be needed, and other additives, prior to placing the mixture in the molding apparatus. A solid epoxy resin is advantageously blended with the other components by heating it to above its melting point in order to mix the components, taking care not to overcure the resin, and mixing the other components in. A heated roller mill is suitable for this purpose. The resulting mixture is then cooled and preferably is formed into pellets or small particles. Another method of making a solid epoxy resin formulation is to mix the AlN, curing agent and other components with a liquid epoxy resin, and then B-stage the epoxy resin. A liquid epoxy resin may be mixed directly with the AlN, curing agent and other components, and used in liquid form.

Heretofore, it was necessary in resin transfer molding processes to preheat the resin particles or pellets to approximately the softening temperature before loading them into the molding apparatus. An advantage of using a resin formulation filled with AlN particles as described herein is that this preheating step may be eliminated. Thus, a second aspect of this invention is an improvement in this transfer molding process, in which the thermosetting resin one which is filled with aluminum nitride particles which have a surface layer which renders the particles hydrolytically stable, and in which the separate preheating step outside of the resin transfer molding apparatus is eliminated. In this second aspect, the surface layer on the AlN particles may be a Si—Al—O—N layer, but is not restricted thereto. Any surface layer may be used which provides improved hydrolytic stability compared to that of AlN particles without such a surface layer. Examples of suitable surface layers include a silica coating, as described in Japanese Kokai H5-247181 (Sep. 24, 1993), incorporated herein by reference; a copper coating, as described in U.S. Pat. No. 5,288,769, incorporated by reference, or a silicone oil coating, as described in U.S. Pat. No. 5,221,339, incorporated by reference. Copper coatings are less preferred because they tend to increase the electrical conductivity of the cured resin.

Once transferred to the mold, the resin is cured through the application of heat. A suitable temperature is from about 150° to about 180° C., but this may vary somewhat according to the particular resin used and the desired degree of curing. Generally, sufficient curing must occur in the mold to permit the molded resin to be demolded without undesired distortion or damage to the encapsulated semiconductor device and its electrical connections to the leads. Because the molding formulation of this invention has high thermal conductivity, it is often possible to substantially reduce the in-mold residence time, which effectively increases the capacity of the molding apparatus. An in-mold residence time of from about 15 seconds to about 1.5 minutes is generally suitable.

Once sufficient in-mold curing is completed, the encapsulated device is demolded. It may then be postcured by heating it outside of the mold to a temperature of from about 150° to about 190° C. for about 30 minutes to about 8 hours, in order to further develop the properties of the resin. Preferably, the resin is postcured until it attains a Tg of at least about 130° C., preferably at least about 140° C., more preferably at least about 150° C. However, a further advantage of this invention is that the need for this postcuring is reduced, meaning that shorter postcuring times (at a given temperature) are required, or that postcuring can be dispensed with altogether, because the formulation cures rapidly in the mold itself.

The following examples are provided to illustrate the invention, but are not intended to limit the scope thereof. All parts and percentages are by weight unless otherwise indicated.

EXAMPLE

The following components are dry blended to form a transfer molding formulation having a filler content of 60% by volume:

| Component | Parts By Weight |
| --- | --- |
| Coated AlN filler[1] | 6000 |
| Silane Coupling Agent[2] | 22.64 |
| Epoxy cresol novolac resin[3] | 883.0 |
| Phenolic Hardener[4] | 463.15 |
| Brominated epoxy resin[5] | 75.47 |
| Cyclic Amine Catalyst[6] | 52.83 |
| Wax Mold Release agents[7] | 30.19 |
| Carbon Black | 22.64 |

[1] Coated with two layers; an Al—O—N layer incorporating amorphous Si—O, and an Si—O layer containing some Al.
[2] Z6040, sold by Dow Corning Corporation.
[3] Sumiepoxy ESCN, sold by Sumitomo Chemical Co., Ltd.
[4] HRJ 2210, sold by Schenectady International, Inc.
[5] Quatrex ® 6410, sold by The Dow Chemical Company.
[6] UCAT SA 841, sold by San-Apro, Ltd.
[7] Hoechst Wax E and Hoechst Wax OP, sold by Hoechst Celanese Corporation.

The resulting powdery mixture is then placed into a roller mill having a hot roller heated to about 100° C. and a cold roller heated to about 30° C. The mixture is heated and processed on the roller mill for about 7–9 minutes, during which time the mixture forms a molten mass and becomes B-staged. The resulting B-staged mixture is then cooled to room temperature and ground in a ball mill to form a coarse powder with a particle size of the order of about 1 millimeter. The coarse powder is then pressed into 30 gram cylindrical pellets of 30 mm diameter.

The pellets are then used in a resin transfer molding process to encapsulate an integrated circuit which is mounted onto and wire bonded to a 68 lead plastic leaded chip carrier (PLCC). The pellets are placed into the plunger pot of a RTM apparatus without preheating, and immediately transferred into the mold cavity, which contains a six cavity strip containing the PLCCs. The transfer pressure is about 800–1200 psi and the transfer time is 5–20 seconds, with 5–10 seconds being more typical. The mold temperature is 175° C.

Because the pellets are not preheated, the only heating of the pellets before they reach the mold cavity is from heat convected to the plunger pot from the heated platens. Despite this lack of preheating, the pellets are easily molded, forming a complete encapsulating layer about the integrated circuit and the wire bonds connecting it with the leads. In addition, the pellets cure sufficiently in 45–60 seconds to be demolded. By contrast, a similar epoxy formulation filled with 60 volume % silica required 2–2.5 minutes in-mold curing, despite the fact that it is preheated to 80° C. before being placed in the plunger pot of the RTM apparatus.

To determine the thermal conductivity of the cured resin, another 68-lead PLCC is encapsulated in the same manner, except that the die paddle (and semiconductor device) are removed. Using the laser flash method, the thermal conductivity of the cured resin is found to be 3.4 W/mK.

The pellets are used in a similar manner to encapsulate an integrated circuit mounted on a 14 lead dual in-line package (DIP). Again, excellent encapsulation of the semiconductor and wire bonds to the lead frame is obtained.

What is claimed is:

1. An encapsulated semiconductor device, comprising:
   (a) a semiconductor device, which is encapsulated in
   (b) a cured thermosetting resin filled with from about 1 to about 90 weight %, based on the combined weight of the resin and aluminum nitride particles, of aluminum nitride particles which have an outer layer of Al—O—N into which amorphous Si—O is incorporated, and which additionally have a layer of Si—O or Si—O—Al on the surface of said Al—O—N layer; and
   (c) a plurality of conductive leads which are in electrical connection with said semiconductor device and which extend through the cured thermosetting resin.

2. The encapsulated semiconductor device of claim 1, wherein said cured thermosetting resin is filled with from about 40 to about 85 weight % of said aluminum nitride particles, based on the combined weight of the epoxy resin and the aluminum nitride particles.

3. The encapsulated semiconductor device of claim 2 which has a thermal conductivity of at least about 2.5 W/mK.

4. The encapsulated semiconductor device of claim 2 wherein said thermosetting resin is an epoxy resin.

5. The encapsulated semiconductor device of claim 4 wherein said conductive leads are in the form of a lead frame, and said leads are wire bonded to said semiconductor device.

6. The encapsulated semiconductor device of claim 5 wherein said wire bonds are encapsulated in said cured thermosetting resin.

7. The encapsulated semiconductor device of claim 6 wherein said AlN particles additionally have a layer of Si—O—Al on the surface of said Al—O—N layer.

8. An epoxy polymer filled with an aluminum nitride-containing powder, wherein the powder comprises AlN particles which have an outer layer of Al—O—N in which amorphous Si—O is incorporated, and which additionally have a layer of Si—O or Si—O—Al on the surface of said Al—O—N layer.

9. The filled epoxy polymer of claim 8 which is filled with from about 40 to about 85 weight % of said aluminum nitride particles, based on the combined weight of the epoxy resin and the aluminum nitride particles.

10. The filled epoxy polymer of claim 8 wherein said AlN particles additionally have a layer of Si—O—Al on the surface of said Al—O—N layer.

* * * * *